United States Patent
Kuikka et al.

(10) Patent No.: US 11,271,507 B2
(45) Date of Patent: Mar. 8, 2022

(54) MOTOR SPEED ESTIMATION FOR DRIVE SAFETY SYSTEM

(71) Applicant: ABB Schweiz AG, Baden (CH)

(72) Inventors: Toni Kuikka, Helsinki (FI); Juho Salminen, Helsinki (FI); Petri Havanto, Helsinki (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/106,733

(22) Filed: Nov. 30, 2020

(65) Prior Publication Data
US 2021/0167710 A1 Jun. 3, 2021

(30) Foreign Application Priority Data
Nov. 28, 2019 (EP) .................................... 19212049

(51) Int. Cl.
*H02P 23/14* (2006.01)
*G01R 31/34* (2020.01)
*H02P 3/06* (2006.01)

(52) U.S. Cl.
CPC ............ *H02P 23/14* (2013.01); *G01R 31/343* (2013.01); *H02P 3/06* (2013.01)

(58) Field of Classification Search
CPC . H02P 23/14; H02P 3/06; H02P 29/10; G05B 9/02; G05B 19/048; G05B 2219/24008
USPC .................................................... 318/445, 34
See application file for complete search history.

(56) References Cited

U.S. PATENT DOCUMENTS

| 8,456,128 B2 * | 6/2013 | Fotherby ................. H02J 3/005 318/800 |
| 2004/0225468 A1 | 11/2004 | McGaughey et al. |
| 2016/0006237 A1 | 1/2016 | Helmerth et al. |

FOREIGN PATENT DOCUMENTS

| EP | 1843461 A2 | 10/2007 |
| EP | 1843461 A3 | 1/2010 |
| EP | 3226406 A1 | 10/2017 |

OTHER PUBLICATIONS

European Patent Office, Extended Search Report issued in corresponding Application No. 19212049.1, dated May 25, 2020, 7 pp.

* cited by examiner

*Primary Examiner* — David Luo
(74) *Attorney, Agent, or Firm* — Leydig, Voit & Mayer, Ltd.

(57) ABSTRACT

According to an aspect, there is provided a method for evaluating safety of a speed of a motor controlled by a frequency converter. The method includes, first, measuring first, second and third phase currents of three-phase electric power fed from the frequency converter to the motor and forming first, second and third current measurement pairs based thereon. Then, the speed of the motor is estimated separately based on each measurement pair to produce respective first, second and third estimates for the speed of the motor. A voting logic is applied to the first, second and third estimates for the speed of the motor. A voting logic is applied to the first, second and third estimates. An output of the voting logic is fed to a safety logic controlling at least one safety function of the frequency converter. The output of the voting logic includes an estimate for the speed of the motor and an indication whether or not said final estimate is valid according to the voting logic.

20 Claims, 4 Drawing Sheets

MOTOR SPEED ESTIMATION FOR DRIVE SAFETY SYSTEM

TECHNICAL FIELD

Various example embodiments relate to control of industrial processes.

BACKGROUND

Drives (or equally frequency converters) are used to control the motion of machines, typically to achieve optimal performance and efficiency from the given machine or machines. Drives are employed in many applications that require precise motion control, for example, in line automation applications employing lifts, cranes and/or conveyor belts. In many applications, it is often of paramount importance that the speed of the motor does not exceed certain pre-defined limits allowed for safe operation. Thus, various schemes for estimating safe motor speeds have been implemented to ensure that this does not happen. Many of such schemes are based on monitoring voltage or two or three phase current associated with the motor. However, said established schemes often struggle or even fail altogether when they are applied to low speed applications where deriving useful voltage/current measurements is often difficult.

Therefore, there is a need for a better way for safety monitoring of motor speeds so as to overcome or alleviate at least some of the aforementioned problems.

BRIEF DESCRIPTION

According to an aspect, there is provided the subject matter of the independent claims. Embodiments are defined in the dependent claims.

One or more examples of implementations are set forth in more detail in the accompanying drawings and the description below. Other features will be apparent from the description and drawings, and from the claims.

Some embodiments provide a method, an apparatus, a system and computer readable media for evaluating speed or frequency of a motor controlled by a frequency converter.

BRIEF DESCRIPTION OF DRAWINGS

In the following, example embodiments will be described in greater detail with reference to the attached drawings, in which FIG. 1 illustrate an exemplary industrial system according to embodiments.

DETAILED DESCRIPTION OF SOME EMBODIMENTS

The following embodiments are only presented as examples. Although the specification may refer to "an", "one", or "some" embodiment(s) and/or example(s) in several locations of the text, this does not necessarily mean that each reference is made to the same embodiment(s) or example(s), or that a particular feature only applies to a single embodiment and/or example. Single features of different embodiments and/or examples may also be combined to provide other embodiments and/or examples.

Figure 1:
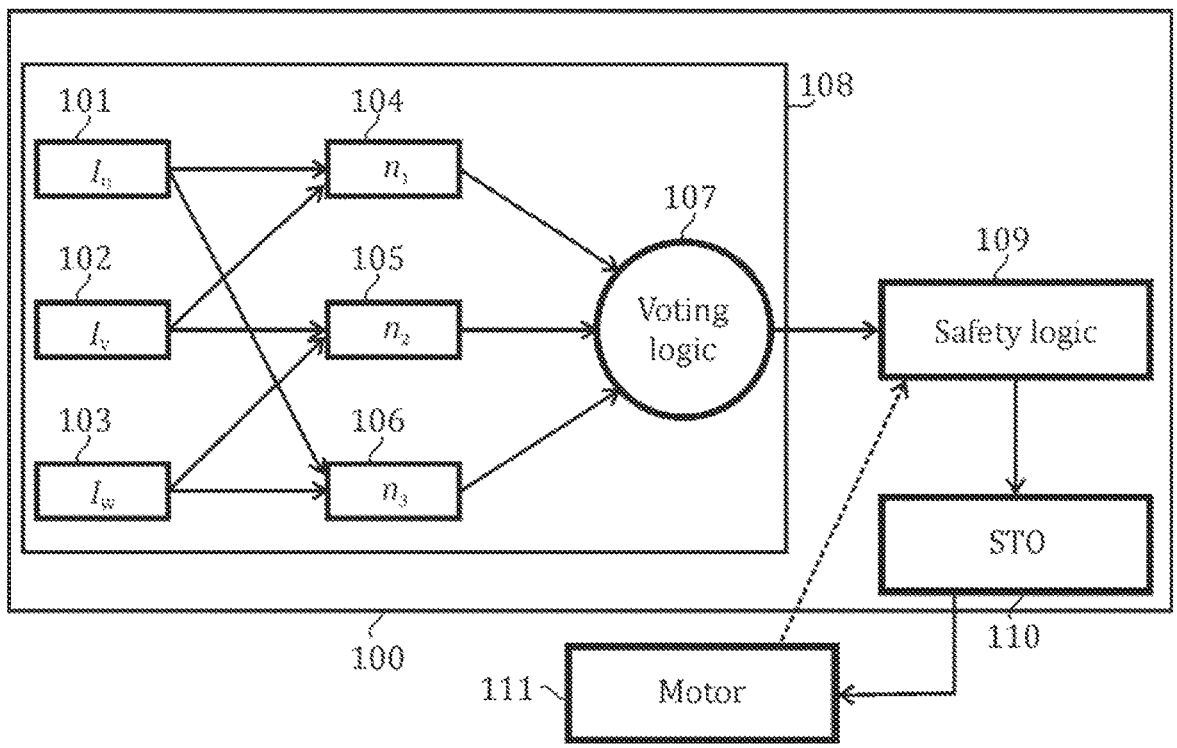

A general architecture of a system to which embodiments of the invention may be applied is illustrated in FIG. 1. FIG. 1 illustrates a simplified system architecture only showing some elements and functional entities (namely, showing only some functional safety related elements and functional entities), all being logical units whose implementation may differ from what is shown. The connections shown in FIG. 1 are logical connections; the actual physical connections may be different. It is apparent to a person skilled in the art that the system may also comprise other functions and structures.

FIG. 1 illustrates a system comprising a drive 100 controlling a motor 111. The drive 100 (equally called a motor drive) comprises at least a voting-based speed analysis unit 108, a safety logic 109 and a STO safety function 110. The motor 111 may be further connected to a mechanical system so that the drive 100, the motor 111 and the mechanical system form together an industrial system (e.g., a production or assembly line system or a part thereof).

The drive 100 is a device used for controlling the motion of the motor 111. Said control may be achieved by changing one or more drive parameters of the drive 100 which may comprise parameters such as torque, speed, power, voltage, frequency, motor control mode (e.g., scalar, vector or direct torque control), proportional-integral-derivative (PID) controller settings, acceleration ramp settings, deceleration ramp settings and/or other parameters affecting the operation of the drive. The drive 100 may specifically be an electrical drive (an AC drive supporting low to high voltages and/or low to high motor speeds). The drive 100 may be equally called a frequency converter. The drive 100 may be a programmable logic controller (PLC) or a (motor) soft starter. In an embodiment, the drive 100 may be a variable speed drive (VSD) or a variable frequency drive (VFD). Contrary to some definitions of term "drive", the motor 111 which is driven does not form a part of the drive 100 itself in the context of this application.

The drive 100 may comprise at least one high-voltage power unit (not shown in FIG. 1) for powering the motor 111 and a low-voltage control unit (comprising at least the elements 108, 109, 110) for providing control signalling to the power unit so as to control the drive parameters of the drive 100 and safety functionalities. In some embodiments, the control and power units may be integrated into a single unit.

The drive 100 may be connected using a (wired) connection to the motor 111 driving industrial or non-industrial processes (i.e., driving a machine, a device, a component, an apparatus or a system for performing an industrial or non-industrial process). Specifically, the drive 100 (or specifically its at least one power unit) feeds the motor 111 via a three-phase power supply. The motor 111 may be, for example, an asynchronous motor (e.g., an induction motor), a synchronous motor (e.g., a permanent magnet motor) or a reluctance motor (e.g., a synchronous reluctance motor). The motor may be used for running, for example, a system for transporting material, such as a pump, a fan, a compressor, a blower, a conveyor belt, a crane and/or an elevator and/or a system for processing materials, such as a paper machine, a mill, a stirrer and/or a centrifuge. While FIG. 1 illustrates a single motor 111, in other embodiments the drive 100 may be used for controlling an electrical machine comprising multiple motors.

The voting-based speed analysis unit 108 is used for evaluating speed of the motor 111 based on three-phase power fed to the motor 111 and for indicating to the safety logic 109 whether the estimated value of the speed of the motor is dependable (i.e., whether or not it can be trusted). In addition to or alternative to the speed of the motor 111, the voting-based speed analysis unit 108 may conduct its analysis based on the frequency of the motor which is a quantity closely connected to the speed of the motor 111 (as will be discussed in more detail below). The voting-based speed analysis unit 108 according to embodiments will be discussed in further detail following the discussion of other elements of the illustrated system.

The safety logic 109 is a unit for managing one or more safety functions of the drive 100 based on a state of the motor 111 and/or of the drive 100. In other words, the safety logic 109 is used for continuously determining whether a particular safety function is to be triggered at a given time. The one or more safety functions may comprise at least the STO safety function 110. In addition to the information received from the voting-based speed analysis unit 108, the safety logic 109 may be configured to receive further information regarding the state of the electric motor from one or more other elements of the drive 100 and/or from one or more elements external to the drive 100. For example, the safety logic may receive information on the rotation speed of the motor 111 from a tachometer. Moreover, the safety logic may employ information on the (current) drive parameters (as listed above) in its analysis. The safety logic may also receive signalling from one or more sensors (e.g., a presence sensor indicating that a person is presently in a dangerous area and/or a sensor indicating that a safety related mechanical door or hatch is currently open) and/or an emergency stop button of the drive 100.

The STO safety function 110 is a basic foundation for drive-based functional safety used for bringing a drive safely to a no-torque state. The STO safety function 110 may be used for preventing an unexpected startup of the motor 111 and/or for stopping the motor 111 (e.g., due to overheat or overspeed protection purposes or as an emergency stop of the motor 111). Specifically, said emergency stop fulfils the stop category 0. The stop category 0 means stopping by immediate removal of power to the machine actuators (i.e. an uncontrolled stop—stopping of machine motion by removing electrical power to the machine actuators). The stopping of the motor 110 may be achieved by shutting down a power unit of the drive 100 in a (pre-defined) controlled manner.

In some embodiments, the drive may comprise (or be connected to), in addition to the STO safety function 110, one or more other safety functions (not shown in FIG. 1). Said one or more other safety functions may comprise, for example, one or more of a safe stop 1 (SS1), a safe stop emergency (SSE) 110, a safely-limited speed (SLS), a safe maximum speed (SMS) and a safe brake control (SBC). Said one or more other safety functions may also be controlled by the safety logic 109 (and/or one or more further safety logics).

While the safety logic 109 and the STO safety function 110 (and one or more other safety functions) may be integral parts of the drive 100 (as illustrated in FIG. 1), in other embodiments, one or more elements may form a separate system (external to the drive 100).

As mentioned above, the drive 100 (or the frequency converter) feeds the motor 111 using a three-phase power supply. These three phases are denoted, in the following, with letters U, V and W following a common convention.

The voting-based speed analysis unit 108 measures a first phase current $I_U$ 101 of three-phase electric power fed from the drive 100 to the motor 111, a second phase current $I_V$ 102 of said three-phase electric power and a third phase current $I_W$ 103 of said three-phase electric power. The first, second and third phase currents $I_U$ 101, $I_V$ 102 and $I_W$ 103 may have phases $\varphi_U$, $\varphi_V = \varphi_U + 120°$ and $\varphi_W = \varphi_U + 240°$, respectively, assuming ideal operation. Then, the voting-based speed analysis unit 108 forms first, second and third current measurement pairs, where the first current measurement pair comprises the first and second phase currents $(I_U, I_V)$, the second current measurement pair comprises to the second and third phase currents $(I_V, I_W)$ and the third current measurement pair comprises to the first and third phase currents $(I_U, I_W)$.

The voting-based speed analysis unit 108 estimates, in elements 104, 105, 106, the speed of the motor 111 separately based on each pair of the first, second and third current measurement pairs $(I_U, I_V)$, $(I_V, I_W)$, $(I_U, I_W)$ to produce respective first, second and third estimates $n_1$, $n_2$, $n_3$ for the speed of the motor (that is, the rotation speed of the motor). For example, the estimating in elements 104, 105, 106 may be carried out so that a separate preliminary estimate for the speed of the motor based on each current in each current measurement pair is, initially, calculated and, then, each of said first, second and third estimates $n_1$, $n_2$, $n_3$ is calculated based on two preliminary estimates associated with a corresponding current measurement pair, e.g., as an average.

The speed of the motor 111 may be estimated in any conventional manner such as on the basis of the frequency of the current feeding the motor 111 (i.e., the frequency of the motor 111), depending on the motor type. For example, the rotation speed of a synchronous motor (synchronous speed) n (given in revolutions per minute, RPM) may be calculated with the equation:

$$n = \frac{f}{p},$$

where f is the frequency of the feeding current in hertz and p is the number of pairs of poles of the motor. The rotation speed of an induction motor, for example, may also be estimated with this equation, although the rotation speed of the induction motor is further affected by slip Δn. In several applications, however, the effect of the slip may be ignored and a sufficiently accurate speed estimate may still be obtained.

The frequency of the feeding current (i.e., the frequency of the motor) may be determined based on a current, for example, by using a phased locked loop. Alternatively, the frequency of the feeding current may be determined based on a zero crossing method, that is, by monitoring spacing (or time period) between consecutive time instances when the feeding current is zero (or alternatively, when the sign of the feeding current function changes from positive to negative or vice versa).

In some embodiments, the voting-based speed analysis unit 108 may estimate, in elements 104, 105, 106, instead of the speed of the motor, the frequency of the motor which, as discussed above, is indicative of the speed of the motor (being directly proportional to it in most applications). In other words, the voting-based speed analysis unit 108 may estimate, in elements 104, 105, 106, the frequency of the motor 111 separately based on each pair of the first, second and third current measurement pairs $(I_U, I_V)$, $(I_V, I_W)$, $(I_U,$ $I_W$) to produce respective first, second and third estimates $f_1$, $f_2$, $f_3$ for the frequency of the motor. This estimation may be carried out in two parts (in an analogous manner as described above for the speed estimation) so that first separate estimates are calculated based on each current in each current measurement pair and, then, each of said first, second and third estimates $f_1$, $f_2$, $f_3$ for the frequency of the motor is calculated based on two estimates associated with a corresponding current measurement pair (e.g., as an average). The frequency may be considered simply as another metric for quantifying the speed of the motor. In such embodiments, the further analysis in elements 107 and/or 108 may be carried out using the frequency, as opposed speed of the motor in RPM.

The voting-based speed analysis unit 108 applies, in element 107, a voting logic to the first, second and third estimates for the speed of the motor (or the frequency) to generate a combined, final estimate and to determine whether or not the final estimate is valid (i.e., trustworthy or dependable). The voting logic 107 may specifically correspond a three-channel voting system implementing a Safety Instrumented System (SIS) voting architecture. The inputs of the voting logic 107 (corresponding to said three channel) may be compared, by the voting logic 107, against pre-defined criteria (e.g., an upper threshold defining that a relative difference between an estimate and one or both of the other two estimates should be less than 10%) and if a certain pre-defined number of the inputs (and/or optionally results of one or more diagnostic tests) indicate a negative result (e.g., no two estimates are within 10% from each other or all three estimates are not within 10% from each other), it is determined that the estimates should not be trusted and thus a negative output is produced. Otherwise, a positive output may be produced.

In some embodiments, the voting logic may employ, in the voting, one or more pre-defined criteria comprising at least an upper threshold for absolute difference or relative difference between any two estimates and/or an upper threshold for absolute difference or relative difference between an estimate and an average of the first, second and third estimates. For example, the voting logic using said upper threshold may require that each acceptable (or valid) estimate should be within 10% from all or one or more other (acceptable) estimates. In other embodiments, an upper threshold for absolute deviation or relative deviation between any two or three estimates and/or an upper threshold for absolute deviation or relative deviation between an estimate and an average of the first, second and third estimates may be defined, instead or in addition. In other embodiments, the pre-defined criteria may comprise a pre-defined upper limit for speed or frequency of the motor and/or a pre-defined lower limit for speed or frequency of the motor.

The voting logic 107 may employ a certain voting architecture, equally called a Safety Instrumented Function (SIF) or Safety Instrumented System (SIS) architecture. Specifically, the voting logic 107 may use one of a one out of three (1oo3) voting architecture, a two out of three (2oo3) voting architecture, a three out of three (3oo3) voting architecture, a one out of three diagnosed (1oo3D) voting architecture, a two out of three diagnosed (2oo3D) voting architecture and a three out of three diagnosed (3oo3D) voting architecture. Two exemplary voting architectures, namely the 2oo3 and 1oo3D voting architectures, are discussed in detail in relation to FIGS. 2A and 2B.

The voting logic 107 may generate as its output at least information on an estimated value of speed or frequency (i.e., a final estimate generated based on the first, second and third estimates) and an indication (e.g., a flag) indicating whether or not the given final estimate is valid (i.e., whether or not it can be trusted). An output comprising an indication indicating that the provided estimate is valid and an indication indicating that that the provided estimate is invalid may be equally called a positive output and a negative output, respectively. Depending on the state of the indication (i.e., valid/invalid), the final estimate for the speed or frequency may be used in different ways in the safety evaluation carried out by the safety logic 109 (or even not used at all).

In some embodiments, the output of the voting logic may, in addition, carry further information regarding the measured and/or estimated values and/or whether they meet the one or more pre-defined criteria. Specifically, the output of the voting logic may comprise information on one or more of:

the measured values of the first current measurement pair;
the measured values of the second current measurement pair;
the measured values of the third current measurement pair;
the first estimate for the speed or frequency of the motor;
the second estimate for the speed or frequency of the motor;
the third estimate for the speed or frequency of the motor;
information on whether the first estimate satisfies the one or more pre-defined criteria;
information on whether the second estimate satisfies the one or more pre-defined criteria;
information on whether the third estimate satisfies the one or more pre-defined criteria;
a diagnostic status of the first estimate;
a diagnostic status of the second estimate; and
a diagnostic status of the third estimate.

The diagnostic status of the first/second/third estimate mentioned above may comprise, for example, information on results of any diagnostic tests carried out for a channel of the voting logic producing the first/second/third estimate, respectively.

The voting-based speed analysis unit 108 feeds the output of the voting logic to a safety logic 109 controlling at least one safety function of the drive. Said at least one safety function may comprise at least the STO safety function 110. Specifically, the safety logic 109 may be configured to receive the output of the voting logic, evaluate one or more pre-defined safety criteria based at least on the output of the voting logic and in response to at least one of the one or more pre-defined safety criteria of the drive failing to be met, trigger one or more safety functions comprising at least the STO safety function 110. The one or more pre-defined safety criteria may comprise at least one safety criterion (e.g., a threshold value) for the estimate of the speed of the motor and/or frequency. Said at least one safety criterion may be evaluated only if it is indicated in the output of the voting logic that the estimate provided therein is valid.

Figure 2A:
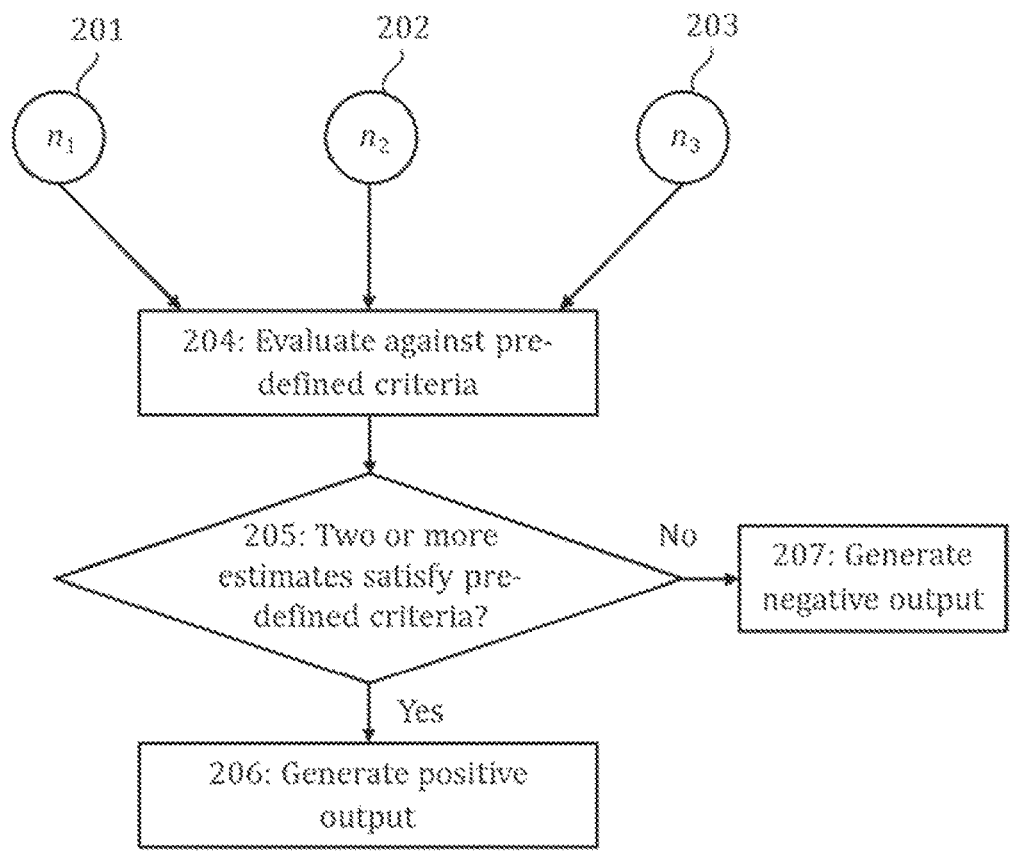
FIGS. 2A and 2B illustrate exemplary voting architectures according to embodiments.
Figure 2B:
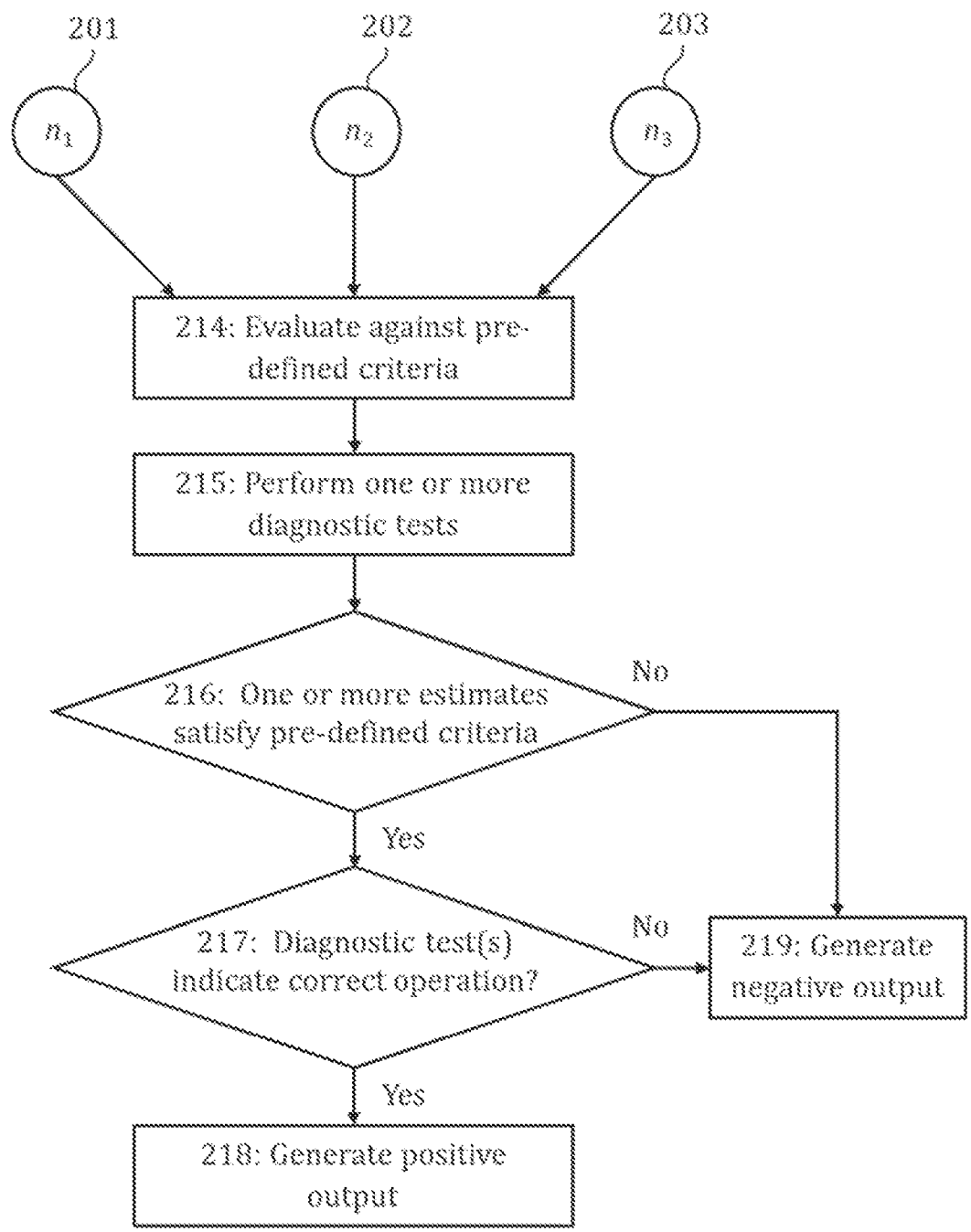

FIGS. 2A and 2B illustrate two exemplary alternative voting architectures according to embodiments which may be employed in the voting logic of the voting-based speed analysis unit of the drive (that is, in element 107 of FIG. 1). Namely, FIG. 2A illustrates 2oo3 voting architecture and FIG. 2B illustrates a 1oo3D voting architecture.

In 2oo3 voting architectures such as the one illustrated in FIG. 2A, at least two of the inputs 201, 202, 203 must fail (i.e., indicate failure) in order for the voting logic to provide a negative output indicating that the estimate is not (very) dependable (and thus should probably not be used evaluating whether or not to trigger the stopping of the motor). Thus, the 2oo3 voting architecture corresponds to a majority voting scenario.

Applying the 2oo3 voting architecture to inputs 201, 202, 203 (e.g., in element 107 of FIG. 1) comprises the following steps. First, the voting logic evaluates, in block 204, the first, second and third estimates for the speed of the motor against one or more pre-defined criteria for allowed speed of the motor. Said one or more pre-defined criteria may specifically define an upper threshold for absolute difference (e.g., 200 RPM) or relative difference (e.g., 10%) between any two estimates for the speed of the motor or between any estimate and an average over the first, second and third estimates. In other words, the voting logic may evaluate, in block 204, whether of each of the first, second and third estimates deviates from the other two estimates by more than is allowed by said threshold. Specifically, it may be defined that the pre-defined threshold is satisfied for a particular estimate if at least one other estimate is within the pre-defined threshold. In other embodiments, deviation or relative deviation may be employed, instead of the absolute difference or the relative difference, as described in relation to FIG. 1.

In response to two or more of the first, second and third estimates satisfying the one or more pre-defined criteria in block 205, the voting logic generates, in block 206, a positive output. Specifically, said positive output may comprise information on an estimated value of speed or frequency (i.e., a final estimate) and an indication (e.g., a flag) indicating that the given speed or frequency estimate is valid (i.e., that it can be trusted). The final estimated value of speed or frequency may be calculated (or generated), by the voting logic, based on all or some of the first, second and third estimates or specifically based on one or more of the first, second and third estimates satisfying the one or more pre-defined criteria (if any exist). The estimated value may be calculated, for example, as an average, a median, a minimum or a maximum over any aforementioned set of one or more estimates.

Conversely, in response to two or more of the first, second and third estimates failing to satisfy the one or more pre-defined criteria (or equally in response to only zero or one of the first, second and third estimates satisfying the one or more pre-defined criteria), the voting logic generates, in block 207, a negative output. Specifically, said negative output may comprise information on an estimated value of speed or frequency and an indication (e.g., a flag) indicating that the given speed or frequency estimate is invalid (i.e., that it cannot be trusted). In this case, the estimated value may be a value satisfying the one or more pre-defined criteria or it may be calculated, for example, as an average, a median, a minimum or a maximum over all estimates.

Embodiments using 1oo3 and 3oo3 voting architectures may operate in a fully analogous manner compared to the 2oo3 voting architecture as discussed in relation to FIG. 2A. The only difference may be, obviously, that the number of estimates that need to satisfy the one or more pre-defined criteria for generating a positive output is one or more (1oo3) or three (3oo3).

In 1oo3D voting architectures such as the one illustrated in FIG. 2B, all three of the inputs 211, 212, 213 must fail (or indicate failure) in order for the voting logic to generate a negative output. Furthermore, 1oo3D voting architecture may utilize (external) diagnostic coverage (i.e., one or more diagnostic tests performed periodically) to improve the detection of dangerous faults (as indicated by the "D" for diagnosed in "1oo3D").

Applying the 1oo3D voting architecture to inputs 211, 212, 213 (e.g., in element 107 of FIG. 1) comprises the following steps. First, the voting logic evaluates, in block 214, the first, second and third estimates for the speed of the motor separately against one or more pre-defined criteria (as described in relation to FIG. 1 and/or FIG. 2A). Then, the voting logic performs, in block 215, one or more diagnostic tests. Specifically, the voting logic may perform one or more diagnostic tests for each of three channels of the voting logic corresponding to the first, second and third estimates. For example, the one or more diagnostic tests may comprise one or more chip input voltage tests and/or one or more memory tests.

In response to all of the first, second and third estimates failing to satisfy the one or more pre-defined criteria, the voting logic generates, in block 219, a negative output. In response to one or more of the first, second and third estimates satisfying the one or more pre-defined criteria in block 216, it is further determined whether the one or more diagnostic tests indicated correct operation for one or more channels of the voting logic corresponding to said one or more of the first, second and third estimates satisfying the one or more pre-defined criteria in block 217. The voting logic may effectively disable one or more channels of the voting logic based on the results of the one or more diagnostic tests in block 217. Thus, in response to none of the first, second and third estimates satisfying the one or more pre-defined criteria while also passing (or to be precise, the corresponding channel passing) the one or more diagnostic tests in block 218, the voting logic also generates, in block 219, a negative output. Only in response to one or more of the first, second and third estimates satisfying the one or more pre-defined criteria and one or more corresponding channels passing the one or more diagnostic tests in block 218, does the voting logic generate, in block 218, a positive output. The negative and positive output may be defined as described in relation to FIGS. 1 and 2A though in some embodiments said negative and positive outputs may also comprise information on the results of the one or more diagnostic tests.

In some embodiments, the checks in blocks 216, 217 may be carried out in a different order.

It should be noted that the one or more diagnostic tests may be carried out periodically with a different period compared to the period of measuring the three phase currents. Specifically, while the measuring of the three phase currents may be effectively a continuous process (or a process associated with a very small period), the one or more diagnostic tests may be carried out less frequently. Despite of this, the operation of the voting logic may also be continuous so that the performing the one or more diagnostic tests in block 215 may comprise merely retrieving the most recent values of the one or more diagnostic tests from a memory.

Embodiments using 2oo3D and 3oo3D voting architectures may operate in a fully analogous manner compared to the 1oo3D voting architecture as discussed in relation to FIG. 2B. The only difference may be, obviously, that the number of estimates that need to satisfy the one or more pre-defined criteria and pass the one or more diagnostic test for generating a positive output is two or more (2oo3D) or three (3oo3D).

While the inputs 201, 202, 203 ($n_1$, $n_2$ and $n_3$) correspond in FIGS. 2A and 2B to estimated speeds of the motor, in other embodiments estimated frequencies of the motor ($f_1$, $f_2$ and $f_3$) may be used, instead, in the voting, similar to as described in relation to FIG. 1. Correspondingly, in such embodiments, the one or more pre-defined criteria may be defined for allowed frequency of the motor and the output of the voting logic may comprise information on an estimated value of frequency and an indication (e.g., a flag) indicating that the given frequency estimate is invalid (i.e., that it cannot be trusted). In some embodiments, the output quantity (i.e., speed or frequency) may be different from the quantity (i.e., frequency or speed, respectively) used in the voting.

Figure 3:
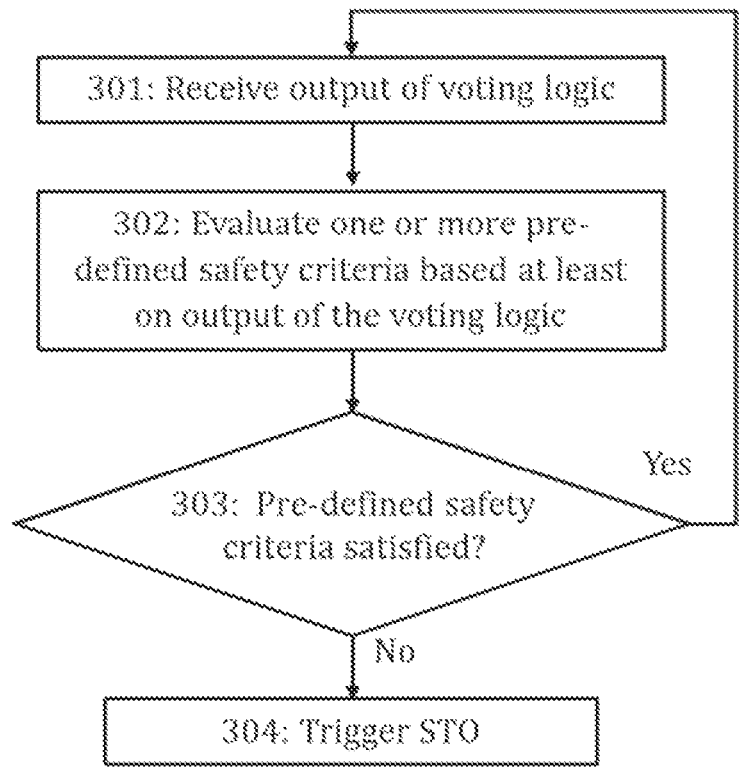
FIG. 3 illustrates a process carried out by a safety logic according to embodiments.

FIG. 3 illustrates a process according to embodiments carried out by a safety logic. Specifically, the illustrated process may be carried out by the safety logic in response to receiving the output of the voting logic. The safety logic in question may be the safety logic 109 of FIG. 1.

Referring to FIG. 3, the safety logic receives, in block 301, an output of a voting logic of the voting-based speed analysis unit. Upon reception, the voting logic evaluates, in block 302, one or more pre-defined safety criteria based at least on the output of the voting logic. In response to at least one of the one or more pre-defined safety criteria of the frequency converter failing to be met in block 303, the safety logic triggers, in block 304, at least one safety function. Said at least one safety function may comprise at least a safe torque off, STO, safety function.

In some embodiments, the one or more pre-defined safety criteria may comprise a pre-defined threshold (or upper and lower thresholds) for a speed or a frequency of a motor controlled by the frequency converter. Here, it is assumed also that the output of the voting logic received in block 301 comprises a final estimate for said speed or frequency of the motor and an indication whether or not said final estimate is valid according to the voting logic. In such embodiments, the evaluating of the one or more pre-defined safety criteria in block 302 comprises evaluating the final estimate against the pre-defined threshold but only in response to the indication indicating that the final estimate is valid. If the final estimate is indicated not to be valid, it may be ignored or used in other (less vital) processes.

The blocks, related functions, and information exchanges described above by means of FIGS. 1, 2A, 2B and 3 are in no absolute chronological order, and some of them may be performed simultaneously or in an order differing from the given one. Other functions can also be executed between them or within them, and other information may be sent, and/or other rules applied. Some of the blocks or part of the blocks or one or more pieces of information can also be left out or replaced by a corresponding block or part of the block or one or more pieces of information.

Figure 4:
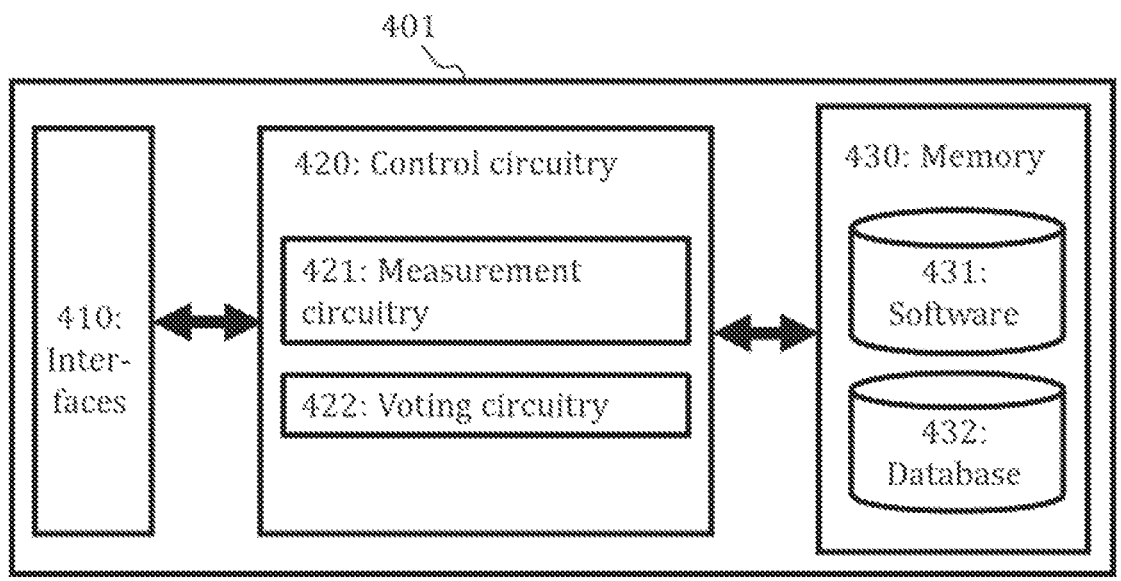
FIGS. 4 and 5 illustrate apparatuses according to embodiments.

FIG. 4 provides a voting-based speed analysis unit 401 according to some embodiments. Specifically, FIG. 4 may illustrate a voting-based speed analysis unit configured to carry out at least the functions described above in connection with estimating speed or frequency of the motor and determining validity of the estimation. The voting-based speed analysis unit 401 may be a voting-based speed analysis unit 108 of FIG. 1. The voting-based speed analysis unit 401 may comprise one or more control circuitry 420, such as at least one processor, and at least one memory 430, including one or more algorithms 431, such as a computer program code (software) wherein the at least one memory and the computer program code (software) are configured, with the at least one processor, to cause the voting-based speed analysis unit to carry out any one of the exemplified functionalities of the voting-based speed analysis unit described above. The at least one processor may be or may comprise, for example, a general-purpose digital signal processor (DSP). Said at least one memory 430 may also comprise at least one database 432.

Referring to FIG. 4, the one or more control circuitry 420 of the voting-based speed analysis unit 401 comprise at least measurement circuitry 421 which is configured to perform measuring of the three phase currents and determining the associated frequencies and speed of the motor. To this end, the measurement circuitry 421 is configured to carry out functionalities described above by means of any of elements 101 to 106 of FIG. 1 using one or more individual circuitries. The one or more control circuitry 420 of the voting-based speed analysis unit 401 further comprises voting circuitry 422 for implementing a voting architecture. The voting circuitry 422 is configured to carry out functionalities described above by means of any of block 107 of FIG. 1, FIG. 2A and/or FIG. 2B using one or more individual circuitries. It is also feasible to use specific integrated circuits, such as ASIC (Application Specific Integrated Circuit) or other components and devices for implementing the functionalities in accordance with different embodiments.

Referring to FIG. 4, the voting-based speed analysis unit 401 may further comprise different interfaces 410 such as one or more communication interfaces comprising hardware and/or software for realizing communication connectivity according to one or more communication protocols. Specifically, the one or more communication interfaces 410 may comprise, for example, an interface providing a connection to a safety logic. The one or more communication interfaces 410 may comprise standard well-known components such as an amplifier, filter, frequency-converter, (de)modulator, and encoder/decoder circuitries, controlled by the corresponding controlling units, and one or more antennas.

Figure 5:
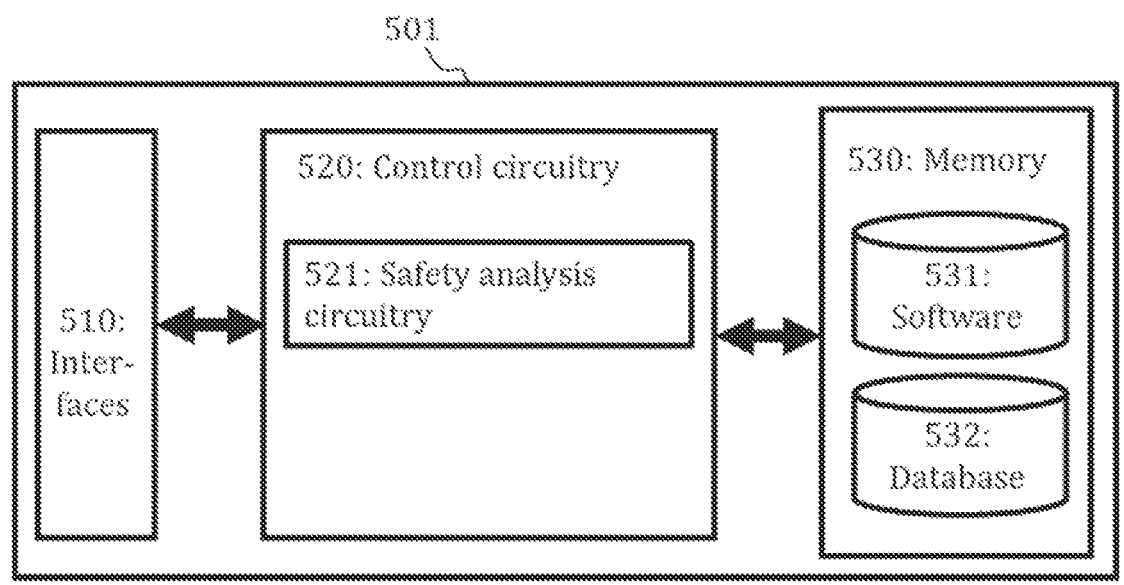

FIG. 5 provides a safety logic 501 according to some embodiments. Specifically, FIG. 5 may illustrate a safety logic configured to carry out at least the functions described above in connection with receiving an output of a voting logic, evaluating one or more safety criteria based at least on said output and triggering a STO and/or other safety function(s) if safety is detected to be compromised. The safety logic 501 may be a safety logic 109 of FIG. 1. The safety logic 501 may comprise one or more control circuitry 520, such as at least one processor, and at least one memory 530, including one or more algorithms 531, such as a computer program code (software) wherein the at least one memory and the computer program code (software) are configured, with the at least one processor, to cause the safety logic to carry out any one of the exemplified functionalities of the safety logic described above. The at least one processor may be or may comprise, for example, a general-purpose digital signal processor (DSP). Said at least one memory 530 may also comprise at least one database 532.

Referring to FIG. 5, the one or more control circuitry 520 of safety logic 501 comprise at least safety analysis circuitry 521 which is configured to perform safety analysis regarding the motor and to control one or more safety functions accordingly. To this end, the safety logic 521 is configured to carry out functionalities described above by means of element 109 of FIG. 1 and FIG. 3 using one or more individual circuitries. It is also feasible to use specific integrated circuits, such as ASIC (Application Specific Integrated Circuit) or other components and devices for implementing the functionalities in accordance with different embodiments.

Referring to FIG. 5, the safety logic 501 may further comprise different interfaces 510 such as one or more communication interfaces comprising hardware and/or software for realizing communication connectivity according to one or more communication protocols. Specifically, the one or more communication interfaces 510 may comprise, for example, an interface providing a connection to one or more safety functions comprising at least a STO. The one or more communication interfaces 510 may comprise standard well-known components such as an amplifier, filter, frequency-converter, (de)modulator, and encoder/decoder circuitries, controlled by the corresponding controlling units, and one or more antennas.

Referring to FIGS. 4 and 5, the memories 430, 530 may be implemented using any suitable data storage technology, such as semiconductor based memory devices, flash memory, magnetic memory devices and systems, optical memory devices and systems, fixed memory and removable memory.

As used in this application, the term 'circuitry' may refer to one or more or all of the following: (a) hardware-only circuit implementations, such as implementations in only analog and/or digital circuitry, and (b) combinations of hardware circuits and software (and/or firmware), such as (as applicable): (i) a combination of analog and/or digital hardware circuit(s) with software/firmware and (ii) any portions of hardware processor(s) with software, including digital signal processor(s), software, and memory(ies) that work together to cause an apparatus, such as a terminal device or an access node, to perform various functions, and (c) hardware circuit(s) and processor(s), such as a microprocessor(s) or a portion of a microprocessor(s), that requires software (e.g. firmware) for operation, but the software may not be present when it is not needed for operation. This definition of 'circuitry' applies to all uses of this term in this application, including any claims. As a further example, as used in this application, the term 'circuitry' also covers an implementation of merely a hardware circuit or processor (or multiple processors) or a portion of a hardware circuit or processor and its (or their) accompanying software and/or firmware. The term 'circuitry' may also cover the term 'logic' (as used in, e.g., 'voting logic').

In an embodiment, at least some of the processes described in connection with FIGS. 1, 2A, 2B and 3 may be carried out by an apparatus comprising corresponding means for carrying out at least some of the described processes. Some example means for carrying out the processes may include at least one of the following: detector, processor (including dual-core and multiple-core processors), digital signal processor, controller, receiver, transmitter, encoder, decoder, memory, RAM, ROM, software, firmware, display, user interface, display circuitry, user interface circuitry, user interface software, display software, circuit, filter (low-pass, high-pass, bandpass and/or bandstop), sensor, circuitry, inverter, capacitor, inductor, resistor, operational amplifier, diode and transistor. In an embodiment, the at least one processor, the memory, and the computer program code form processing means or comprises one or more computer program code portions for carrying out one or more operations according to any one of the embodiments of FIGS. 1, 2A, 2B and 3 or operations thereof. In some embodiments, at least some of the processes may be implemented using discrete components.

Embodiments as described may also be carried out, fully or at least in part, in the form of a computer process defined by a computer program or portions thereof. Embodiments of the methods described in connection with FIGS. 1, 2A, 2B and 3 may be carried out by executing at least one portion of a computer program comprising corresponding instructions. The computer program may be provided as a computer readable medium comprising program instructions stored thereon or as a non-transitory computer readable medium comprising program instructions stored thereon. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a person of ordinary skill in the art.

The embodiments may be implemented in existing systems, such as in inverters and/or surveillance systems of drives, or discrete elements and devices may be used in a centralized or decentralized manner. Existing devices, such as inverters, typically comprise a processor and a memory which may be utilized in implementing the functionality of the embodiments. Thus, the changes and assemblies required by the implementation of the embodiments may, at least partly, be taken care of by software routines, which, in turn, may be implemented as added or updated software routines (being defined as described in the previous paragraph).

Even though the embodiments have been described above with reference to examples according to the accompanying drawings, it is clear that the embodiments are not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. A method for evaluating a speed or a frequency of a motor controlled by a frequency converter, the method comprising:
    measuring first, second and third phase currents of three-phase electric power fed from the frequency converter to the motor;
    forming first, second and third current measurement pairs, wherein the first current measurement pair comprises the first phase current and the second phase current, the second current measurement pair comprises the second phase current and the third phase current and the third current measurement pair comprises the third phase current and the first phase current;
    estimating the speed or frequency of the motor separately based on each pair of the first, second and third current measurement pairs to produce respective first, second and third estimates for the speed or frequency of the motor,
    applying a voting logic to the first, second and third estimates for the speed or frequency of the motor, wherein the voting logic employs, in the voting, one or more pre-defined criteria and is based on one of the following:
        a one out of three, 1oo3, voting architecture,
        a two out of three, 2oo3, voting architecture, a three out of three, 3oo3, voting architecture, a one out of three diagnosed, 1oo3D, voting architecture, a two out of three diagnosed, 2oo3D, voting architecture and a three out of three diagnosed, 3oo3D, voting architecture; and feeding an output of the voting logic to a safety logic controlling at least one safety function of the frequency converter, wherein the output of the voting logic comprises a final estimate for the speed or frequency of the motor and an indication whether or not said final estimate is valid according to the voting logic.

2. The method of claim 1, wherein the one or more pre-defined criteria comprise at least an upper threshold for absolute difference or relative difference, between any two estimates or between an estimate and an average of the first, second and third estimates or an upper threshold for absolute deviation or relative deviation between any two or three estimates or between an estimate and an average of the first, second and third estimates.

3. The method of claim 2, wherein said at least one safety function comprises at least a safe torque off, STO, safety function.

4. The method according to claim 3, wherein the estimating of the speed of the motor separately based on each of the first current measurement pair, the second current measurement pair and the third current measurement pair comprises performing, for each current measurement pair, the following:

estimating a frequency of the three-phase electric power fed to the motor separately based on each of two phase currents in said current measurement pair;

calculating two preliminary estimates for the speed of the motor separately based on the estimated frequencies; and calculating an estimate for the speed of the motor as an average over the two preliminary estimates for the speed of the motor, wherein the estimating of the frequency of the motor separately based on each of the first current measurement pair, the second current measurement pair and the third current measurement pair comprises performing, for each current measurement pair, the following:

estimating a frequency of the three-phase electric power fed to the motor by averaging frequencies calculated based on two phase currents in said current measurement pair.

5. The method according to claim 2, wherein the estimating of the speed of the motor separately based on each of the first current measurement pair, the second current measurement pair and the third current measurement pair comprises performing, for each current measurement pair, the following:

estimating a frequency of the three-phase electric power fed to the motor separately based on each of two phase currents in said current measurement pair;

calculating two preliminary estimates for the speed of the motor separately based on the estimated frequencies; and calculating an estimate for the speed of the motor as an average over the two preliminary estimates for the speed of the motor, wherein the estimating of the frequency of the motor separately based on each of the first current measurement pair, the second current measurement pair and the third current measurement pair comprises performing, for each current measurement pair, the following:

estimating a frequency of the three-phase electric power fed to the motor by averaging frequencies calculated based on two phase currents in said current measurement pair.

6. The method of claim 1, wherein said at least one safety function comprises at least a safe torque off, STO, safety function.

7. The method according to claim 6, wherein the estimating of the speed of the motor separately based on each of the first current measurement pair, the second current measurement pair and the third current measurement pair comprises performing, for each current measurement pair, the following:

estimating a frequency of the three-phase electric power fed to the motor separately based on each of two phase currents in said current measurement pair;

calculating two preliminary estimates for the speed of the motor separately based on the estimated frequencies; and calculating an estimate for the speed of the motor as an average over the two preliminary estimates for the speed of the motor, wherein the estimating of the frequency of the motor separately based on each of the first current measurement pair, the second current measurement pair and the third current measurement pair comprises performing, for each current measurement pair, the following:

estimating a frequency of the three-phase electric power fed to the motor by averaging frequencies calculated based on two phase currents in said current measurement pair.

8. The method according to claim 1, wherein the estimating of the speed of the motor separately based on each of the first current measurement pair, the second current measurement pair and the third current measurement pair comprises performing, for each current measurement pair, the following:

estimating a frequency of the three-phase electric power fed to the motor separately based on each of two phase currents in said current measurement pair;

calculating two preliminary estimates for the speed of the motor separately based on the estimated frequencies; and calculating an estimate for the speed of the motor as an average over the two preliminary estimates for the speed of the motor, wherein the estimating of the frequency of the motor separately based on each of the first current measurement pair, the second current measurement pair and the third current measurement pair comprises performing, for each current measurement pair, the following:

estimating a frequency of the three-phase electric power fed to the motor by averaging frequencies calculated based on two phase currents in said current measurement pair.

9. The method according to claim 1, wherein the voting logic uses the 2oo3 voting architecture, the applying of the voting logic comprising:

evaluating the first, second and third estimates for the speed or frequency of the motor separately against the one or more pre-defined criteria;

in response to two or more of the first, second and third estimates failing to satisfy the one or more pre-defined criteria, generating a negative output comprising the final estimate for the speed or frequency of the motor and an indication indicating that the final estimate is not valid; and in response to two or more of the first, second and third estimates satisfying the one or more pre-defined criteria, generating a positive output comprising the final estimate for the speed or frequency of the motor and an indication indicating that the final estimate is valid.

10. The method according to claim 1, wherein the voting logic uses the 1oo3D voting architecture, the applying of the voting logic comprising:
evaluating the first, second and third estimates for the speed or frequency of the motor separately against the one or more pre-defined criteria;
performing one or more diagnostic tests for each of three channels of the voting logic corresponding to the first, second and third estimates;
in response to none of the first, second and third estimates satisfying the one or more pre-defined criteria while also passing the one or more diagnostic tests, generating a negative output comprising the final estimate for the speed or frequency of the motor and an indication indicating that the estimate is not valid; and
in response to one or more of the first, second and third estimates satisfying the one or more pre-defined criteria while also passing the one or more diagnostic tests, generating a positive output comprising the final estimate for the speed or frequency of the motor and an indication indicating that the estimate is valid.

11. The method of claim 10, wherein said one or more diagnostic tests comprise one or more chip input voltage tests and/or one or more memory tests.

12. The method according to claim 1, wherein the final estimate for the speed or frequency of the motor is generated, by the voting logic, based on all of the first, second and third estimates or based on one or more of the first, second and third estimates satisfying the one or more pre-defined criteria.

13. The method according to claim 1, wherein the final estimate is calculated as an average, a median, a minimum or a maximum over a set of one or more estimates.

14. The method according to claim 1, wherein each output of the voting logic comprises information on one or more of:
the measured values of the first current measurement pair;
the measured values of the second current measurement pair;
the measured values of the third current measurement pair;
the first estimate for the speed or frequency of the motor;
the second estimate for the speed or frequency of the motor;
the third estimate for the speed or frequency of the motor;
information on whether the first estimate satisfies the one or more pre-defined criteria;
information on whether the second estimate satisfies the one or more pre-defined criteria;
information on whether the third estimate satisfies the one or more pre-defined criteria;
a diagnostic status of the first estimate;
a diagnostic status of the second estimate; and
a diagnostic status of the third estimate.

15. An apparatus comprising:
at least one processor; and
at least one memory including computer program code, said at least one memory and computer program code being configured, with said at least one processor, to cause
measuring first, second and third phase currents of three-phase electric power fed from a frequency converter to a motor;
forming first, second and third current measurement pairs, wherein the first current measurement pair comprises the first phase current and the second phase current, the second current measurement pair comprises the second phase current and the third phase current and the third current measurement pair comprises the third phase current and the first phase current;
estimating a speed or a frequency of the motor separately based on each pair of the first, second and third current measurement pairs to produce respective first, second and third estimates for the speed or frequency of the motor,
applying a voting logic to the first, second and third estimates for the speed or frequency of the motor, wherein the voting logic employs, in the voting, one or more pre-defined criteria and is based on one of the following:
a one out of three, 1oo3, voting architecture,
a two out of three, 2oo3, voting architecture,
a three out of three, 3oo3, voting architecture,
a one out of three diagnosed, 1oo3D, voting architecture,
a two out of three diagnosed, 2oo3D, voting architecture; and
feeding an output of the voting logic to a safety logic controlling at least one safety function of the frequency converter, wherein the output of the voting logic comprises a final estimate for the speed or frequency of the motor and an indication whether or not said final estimate is valid according to the voting logic.

16. A non-transitory computer readable media having stored thereon instructions that, when executed by a computing device, cause the computing device to perform an evaluation of a speed or a frequency of a motor controlled by a frequency converter, comprising:
measuring first, second and third phase currents of three-phase electric power fed from the frequency converter to the motor;
forming first, second and third current measurement pairs, wherein the first current measurement pair comprises the first phase current and the second phase current, the second current measurement pair comprises the second phase current and the third phase current and the third current measurement pair comprises the third phase current and the first phase current;
estimating the speed or frequency of the motor separately based on each pair of the first, second and third current measurement pairs to produce respective first, second and third estimates for the speed or frequency of the motor,
applying a voting logic to the first, second and third estimates for the speed or frequency of the motor, wherein the voting logic employs, in the voting, one or more pre-defined criteria and is based on one of the following:
a one out of three, 1oo3, voting architecture,
a two out of three, 2oo3, voting architecture,
a three out of three, 3oo3, voting architecture,
a one out of three diagnosed, 1oo3D, voting architecture,
a two out of three diagnosed, 2oo3D, voting architecture; and
feeding an output of the voting logic to a safety logic controlling at least one safety function of the frequency converter, wherein the output of the voting logic comprises a final estimate for the speed or frequency of the motor and an indication whether or not said final estimate is valid according to the voting logic.

17. A frequency converter comprising:
a voting-based speed analysis unit comprising at least one processor; and at least one memory including computer program code, said at least one memory and computer program code being configured, with said at least one processor, to cause;
measuring first, second and third phase currents of three-phase electric power fed from the frequency converter to the motor;
forming first, second and third current measurement pairs, wherein the first current measurement pair comprises the first phase current and the second phase current, the second current measurement pair comprises the second phase current and the third phase current and the third current measurement pair comprises the third phase current and the first phase current;
estimating the speed or frequency of the motor separately based on each pair of the first, second and third current measurement pairs to produce respective first, second and third estimates for the speed or frequency of the motor,
applying a voting logic to the first, second and third estimates for the speed or frequency of the motor, wherein the voting logic employs, in the voting, one or more pre-defined criteria and is based on one of the following:
a one out of three, 1oo3, voting architecture,
a two out of three, 2oo3, voting architecture,
a three out of three, 3oo3, voting architecture,
a one out of three diagnosed, 1oo3D, voting architecture,
a two out of three diagnosed, 2oo3D, voting architecture; and
feeding an output of the voting logic to a safety logic controlling at least one safety function of the frequency converter, wherein the output of the voting logic comprises a final estimate for the speed or frequency of the motor and an indication whether or not said final estimate is valid according to the voting logic; and
a safety logic comprising at least one processor; and at least one memory including computer program code, said at least one memory and computer program code being configured, with said at least one processor, to cause:
receiving an output of a voting logic of the voting-based speed analysis unit;
evaluating one or more pre-defined safety criteria based at least one the output of the voting logic; and
in response to at least one of the one or more pre-defined safety criteria of the frequency converter failing to be met, triggering at least a safe torque off, STO, safety function.

18. The frequency converter of claim 17, further comprising:
one or more safety functions comprising at least the STO safety function.

19. The frequency converter of claim 18, wherein the one or more pre-defined safety criteria comprise a pre-defined threshold for a speed or a frequency of a motor controlled by the frequency converter and the output of the voting logic comprises a final estimate for said speed or frequency of the motor and an indication whether or not said final estimate is valid according to the voting logic, the evaluating of the one or more pre-defined safety criteria comprising:
in response to the indication indicating that the final estimate is valid, evaluating the final estimate against the pre-defined threshold.

20. The frequency converter of claim 17, wherein the one or more pre-defined safety criteria comprise a pre-defined threshold for a speed or a frequency of a motor controlled by the frequency converter and the output of the voting logic comprises a final estimate for said speed or frequency of the motor and an indication whether or not said final estimate is valid according to the voting logic, the evaluating of the one or more pre-defined safety criteria comprising:
in response to the indication indicating that the final estimate is valid, evaluating the final estimate against the pre-defined threshold.

* * * * *